United States Patent [19]

Miyamoto

[11] Patent Number: 5,257,235
[45] Date of Patent: Oct. 26, 1993

[54] SEMICONDUCTOR MEMORY DEVICE HAVING SERIAL ACCESS MODE

[75] Inventor: Junichi Miyamoto, Yokohama, Japan

[73] Assignee: Kabushiki Kaisha Toshiba, Kawasaki, Japan

[21] Appl. No.: 864,380

[22] Filed: Apr. 6, 1992

Related U.S. Application Data

[63] Continuation of Ser. No. 514,266, Apr. 25, 1990, abandoned.

Foreign Application Priority Data

Apr. 25, 1989 [JP] Japan .................... 1-105294

[51] Int. Cl.⁵ .................................. G11C 8/04
[52] U.S. Cl. ..................... 365/230.03; 365/189.05; 365/189.12; 365/221; 365/238.5; 365/240
[58] Field of Search ........... 365/230.03, 230.24, 365/238.5, 221, 239, 240, 189.04, 189.12

[56] References Cited

U.S. PATENT DOCUMENTS

| | | | |
|---|---|---|---|
| 4,715,017 | 12/1987 | Iwahashi . | |
| 4,891,795 | 1/1990 | Pinkham et al. | 365/230.03 |
| 4,899,310 | 2/1990 | Baba et al. | 365/230.03 |
| 5,018,100 | 5/1991 | Yanagisawa | 365/230.03 |
| 5,021,998 | 6/1991 | Suzuki et al. | 365/230.03 |
| 5,121,354 | 6/1992 | Mandalia | 365/230.04 |

OTHER PUBLICATIONS

"High-Speed SRAMS", Buster Ashmore, et al., IEEE International Solid-State Circuit Conference, 1989, pp. 40–41.

*Primary Examiner*—Joseph E. Clawson, Jr.
*Attorney, Agent, or Firm*—Banner, Birch, McKie & Beckett

[57] ABSTRACT

A memory device includes first to Sth (S is an integer of 2 or more) memory cell arrays, first to Sth sense amplifier/latch circuits connected to bit lines of these memory cell arrays, and a latch control circuit for inputting and latching data read out from the memory cell arrays to the sense amplifier/latch circuits. In a serial access mode, when a memory cell in the Pth (P is an integer of 1 to S−1) is selected, storage data read out from memory cells belonging to a row of the selected cell in the (P+1)th memory cell array are input and latched to the Pth and (P+1)th sense amplifier/latch circuit by the latch control circuit. When the Sth memory cell array is selected by the access start address, storage data read out from memory cells belonging to a row of the selected cell in the Sth memory cell array and storage data read out from memory cells belonging to a next row of the selected cell in the first memory cell array are input and latched to the Sth and first sense amplifier/latch circuits, respectively. Data latched by the Pth or Sth sense amplifier/latch circuit are read out from the access start address in an order of column addresses, and data latched by the (P+1)th or first sense amplifier/latch circuit are sequentially read out in response to column addresses, respectively.

11 Claims, 8 Drawing Sheets

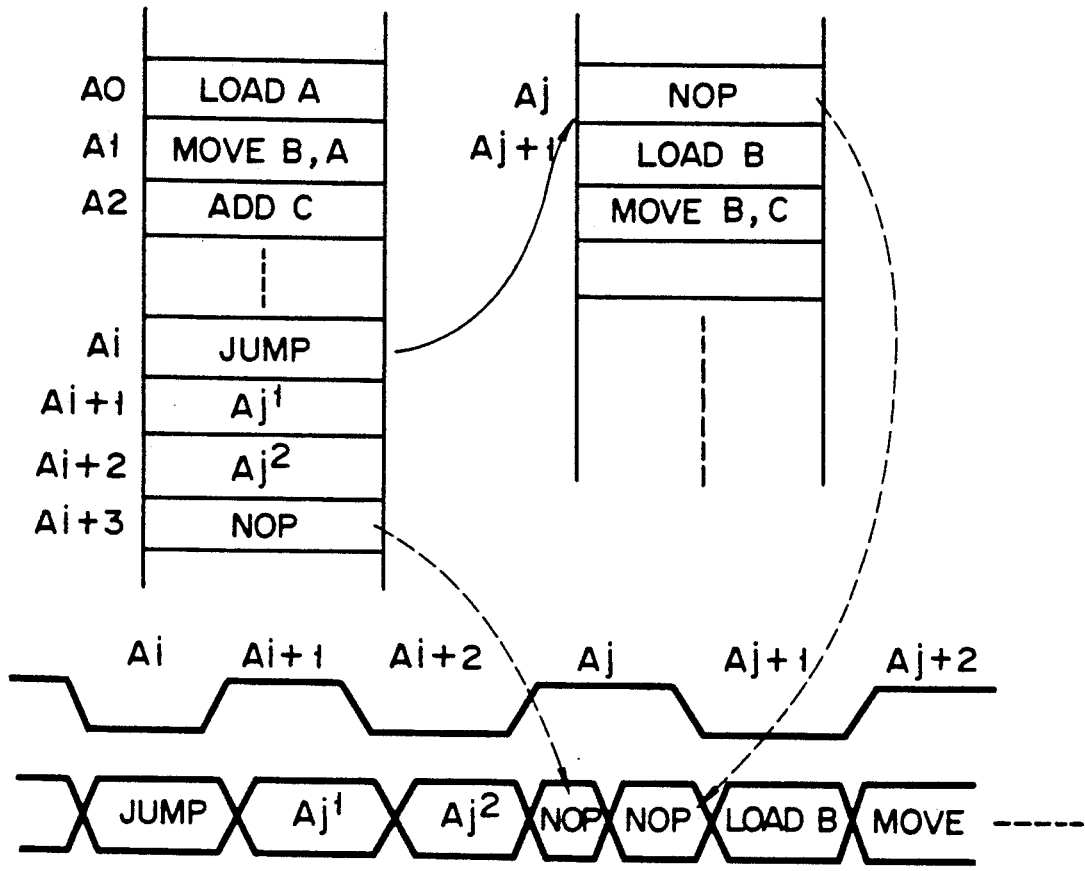
F I G. 3

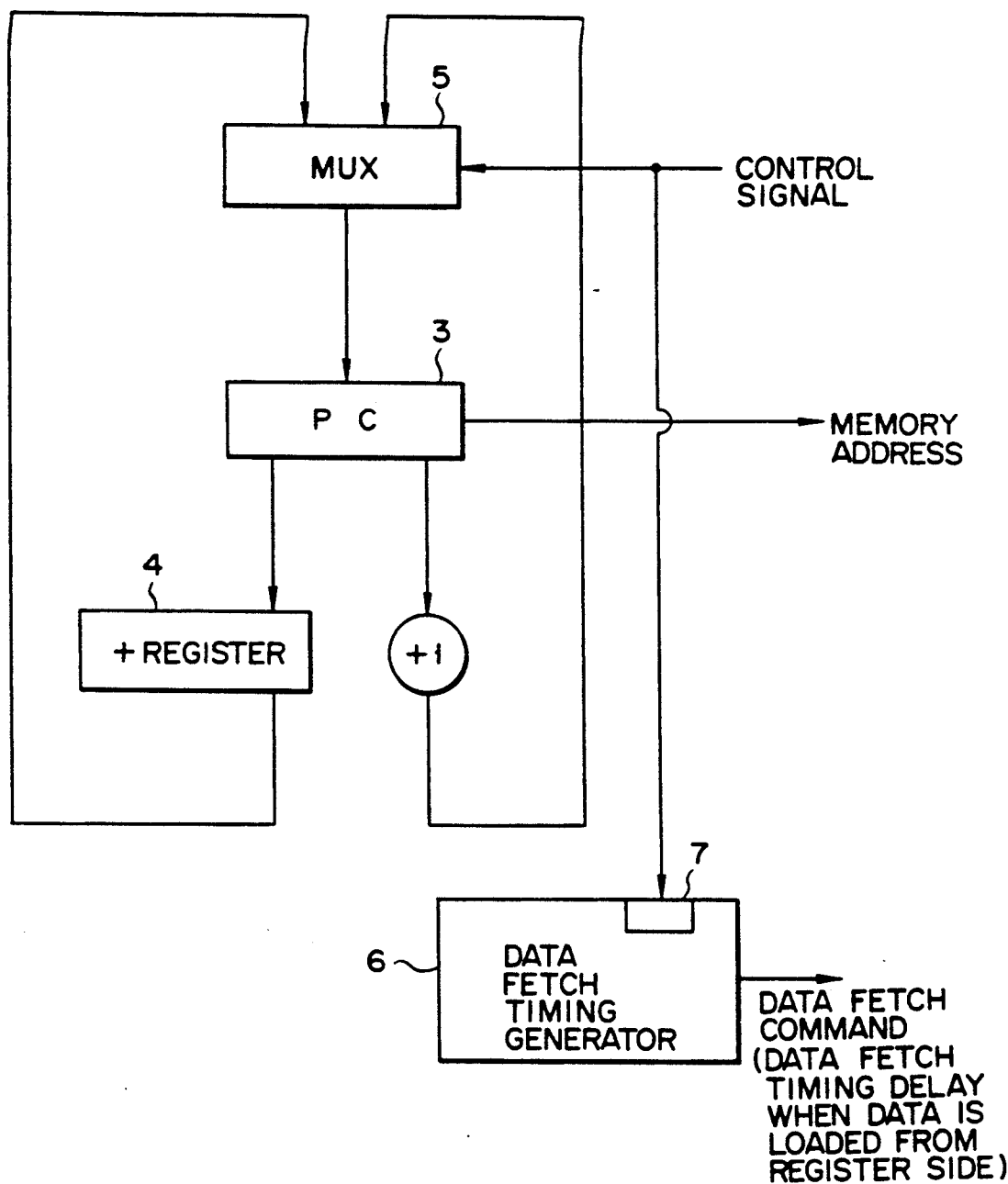
F I G. 4

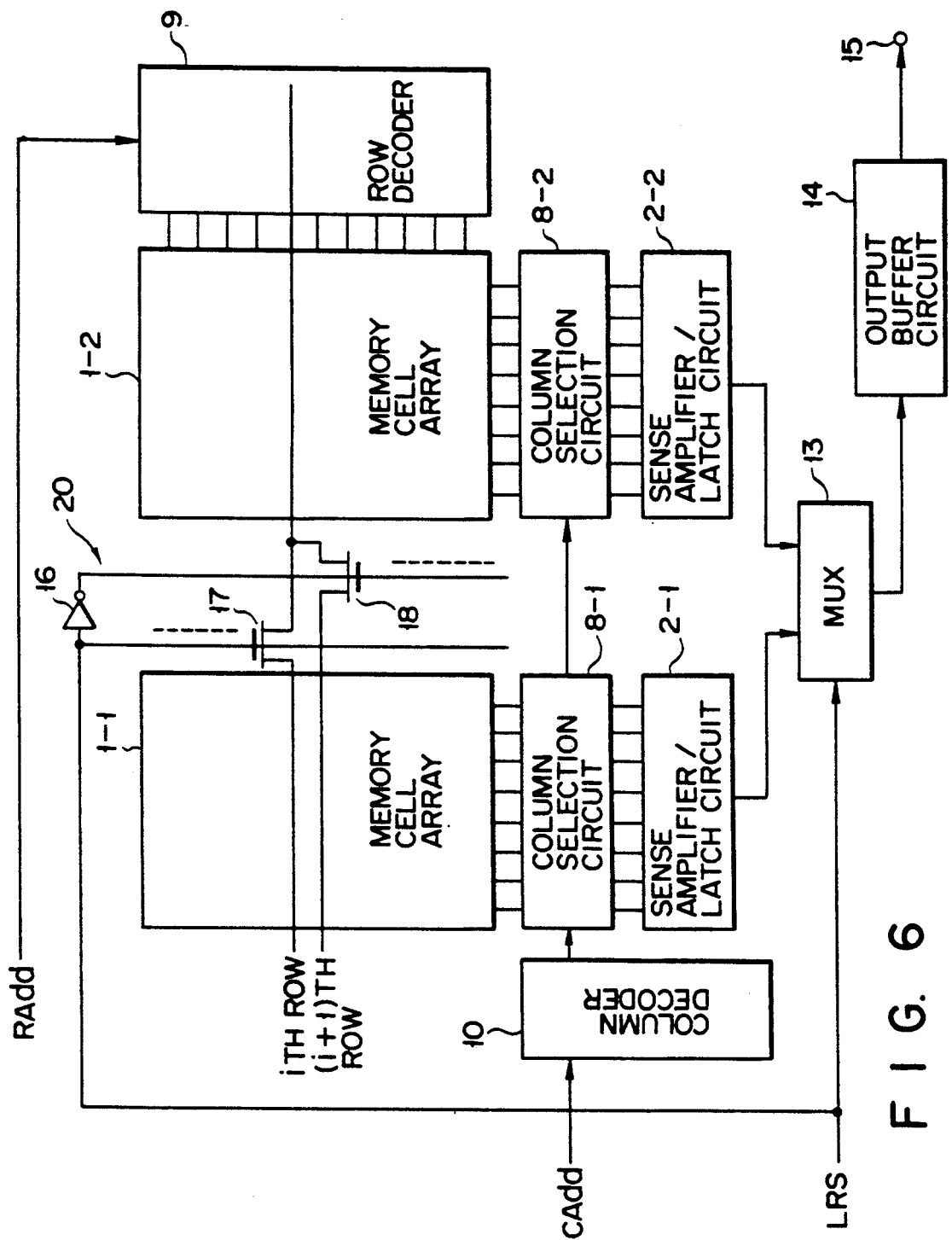
F I G. 6

SEMICONDUCTOR MEMORY DEVICE HAVING SERIAL ACCESS MODE

This application is a continuation of application Ser. No. 07/514,266, filed Apr. 25, 1990, now abandoned.

BACKGROUND OF THE INVENTION

1. Field of the Invention

The present invention relates to a semiconductor memory device having a serial access mode and, more particularly, to a semiconductor memory device having a higher operation speed in serial access than that in random access.

2. Description of the Related Art

In an access scheme of a random access type semiconductor memory device, data is almost serially read out. In order to increase a serial access speed, a scheme in which a latch circuit for latching storage data of one-line memory cells connected to a selected word line is arranged, and data is serially read out from the latch circuit has been conventionally considered. That is, a sense amplifier/latch circuit is connected to bit lines arranged in a memory cell array. When a word line is selected storage data of one-line memory cells connected to this word line are detected and amplified by the sense amplifier section of the sense amplifier/latch circuit and latched by the latch section. The data latched by the latch section are sequentially and serially read out in response to column addresses of the memory cell array.

By employing the above scheme, a series of operations, i.e., selection of a word line corresponding to each memory cell and amplification of data read out from the memory cells, can be omitted. Therefore, an access time can be decreased to ½ or less the random access time. When a column address is caused to correspond to an LSB of an input address and serial access is performed, data can be read out at a higher speed than random access.

However, in the above described scheme, the maximum number of bytes capable of high-speed accessing is limited to the number of latch sections (e.g., X bytes), i.e., the number of bits of a column of a memory cell array. Data cannot always be read from all the X bytes depending on an address randomly accessed first (an accessed address represents a position near a change in row). In addition, when a memory device employing the above scheme is accessed by a CPU, the following system must be arranged. When the device is randomly accessed, a wait command is sent to the CPU and a data fetch period is prolonged from one cycle to two cycles. On the contrary, when the device is serially accessed, data is fetched without the wait command. However, when the scheme is employed, an address of a memory device which receives the wait command is physically determined, thus resulting in a cumbersome operation in the CPU. In order to avoid this, a wait signal is output from the memory device, and data representing random access or serial access is sent to the CPU. However, a large number of memory devices are supported by a CPU, and a logic circuit such as a multiplexer is required to receive the wait signal. Therefore, an advantage of high-speed serial access cannot be sufficiently utilized. The memory device requires an external connection pin for sending the wait signal, and it is far from a standard memory device.

SUMMARY OF THE INVENTION

It is therefore an object of the present invention to provide a semiconductor memory device in which when storage data is serially read out, the data can be continuously read out at a higher speed than random access from any address without being limited to a physical architecture.

In order to achieve the above object of the present invention, there is provided a semiconductor device comprising the first to Sth (S is an integer of 2 or more) memory cell arrays constituted by arranging memory cells in a matrix form, a sense amplifier, connected to each of the first to Sth memory cell arrays, for amplifying data read out from the memory cell, and a latch circuit for simultaneously latching, when a memory cell of the first to (S−1)th memory cell arrays is selected as an access start address in a serial access mode, storage data read out from memory cells belonging to a row of the selected cell in the Pth (P is an integer of 1 to S−1) memory cell array and storage data read out from memory cells belonging to a row of the selected cell in the (P+1)th memory cell array, and for simultaneously latching, when a memory cell is selected from the Sth memory cell array as an access start address, storage data read out from memory cells belonging to a row of the selected cell in the Sth memory cell array and storage data read out from memory cells belonging to a row defined by adding "1" to the row of the selected memory cell in the first memory cell array.

In the above described arrangement, even if an address of a memory cell selected as a serial access start address is located near a change in row, the storage data read out from the memory cells belonging to the row of the selected memory cell in the Sth memory cell array and the storage data obtained by adding "1" to the row of the selected memory cells in the first memory cell array are simultaneously latched in a latch circuit, thereby performing continuous serial access.

Therefore, there is provided a semiconductor memory device wherein when storage data is serially read out, the storage data can be read out from any addresses at a higher speed than random access without being limited to a physical architecture.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a timing chart, for explaining a sequence for accessing the memory device shown in FIGS. 1A and 1B, showing commands stored in the memory device associated with its operation;

FIG. 4 is a block diagram for explaining a sequence for accessing the memory device shown in FIGS. 1A and 1B;

FIG. 6 is a circuit diagram showing another arrangement of a memory device for performing the operational principle shown in FIGS. 1A and 1B.

DETAILED DESCRIPTION OF THE PREFERRED EMBODIMENTS

Figure 1A:
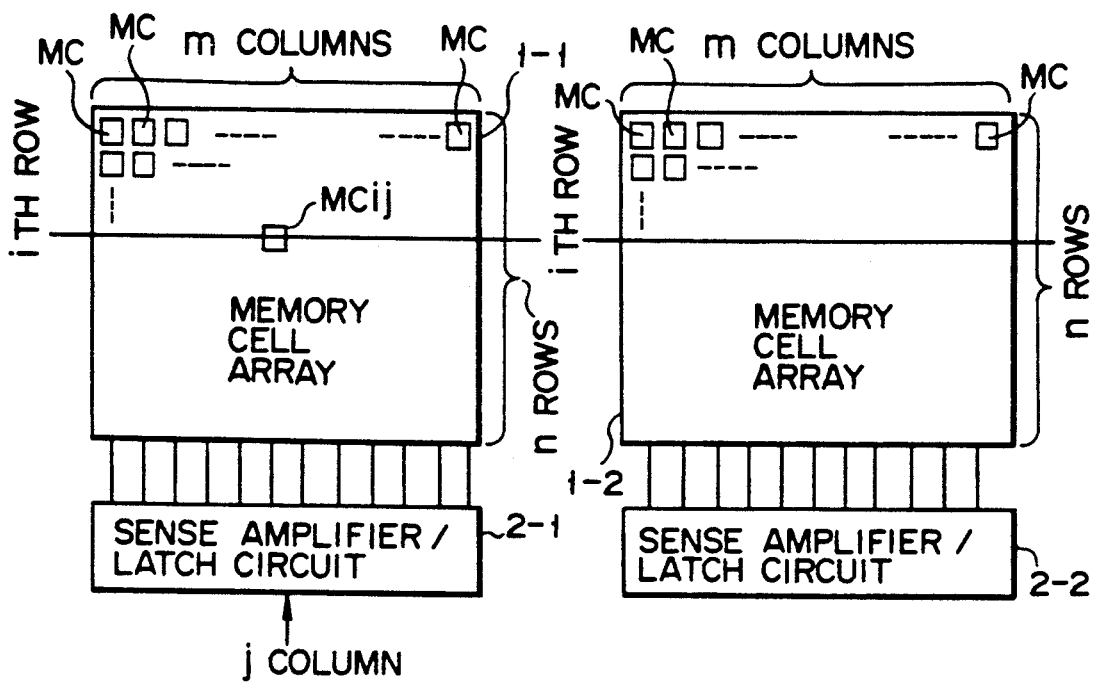
FIGS. 1A and 1B are block diagrams, for explaining the principle of a semiconductor memory device according to the first embodiment of the present invention, showing two selection states of a row address in a serial access mode.
Figure 1B:
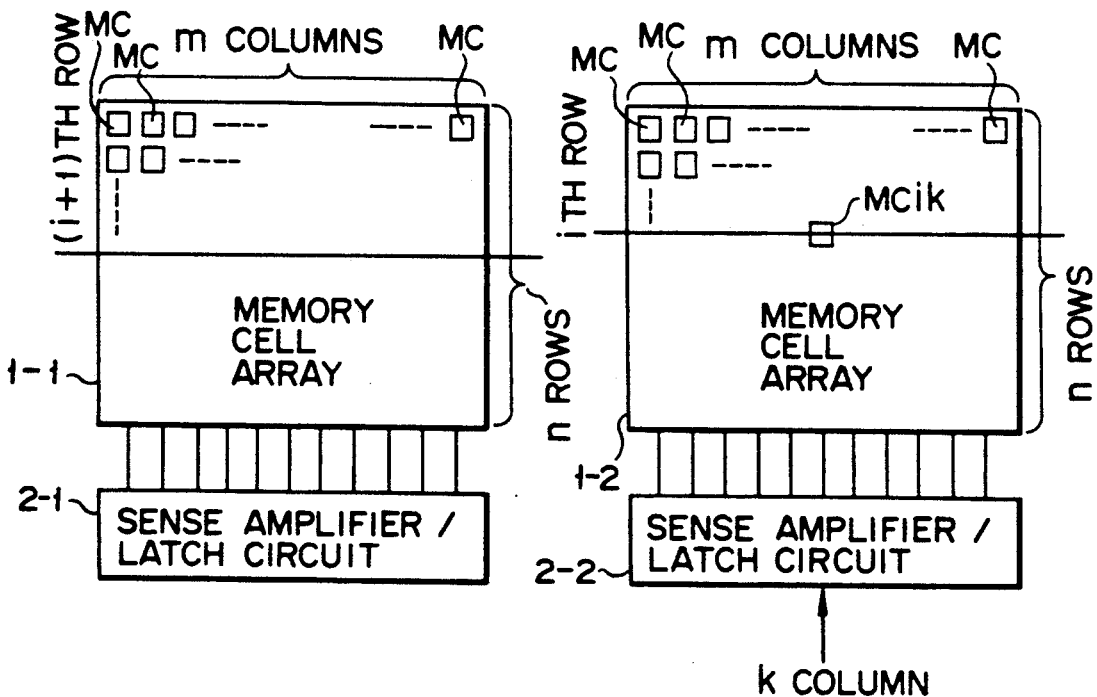

FIGS. 1A and 1B are block diagrams for explaining the principle of a semiconductor device according to the first embodiment of the present invention. FIGS. 1A and 1B show two selection states of a row address in a serial access mode. This memory device include two memory cell arrays 1-1 and 1-2 each comprising memory cells MC arranged in an n×m matrix form. N row lines (word lines) are connected to the rows of the memory cells MC in each of the memory cell arrays 1-1 and 1-2, and m (or m-paired) column lines (bit lines) are connected to the columns of the memory cells MC in each of the memory cell arrays 1-1 and 1-2. Addresses from the 0th address to the (m-1)th address are assigned to the memory cells MC arranged from the upper left corner to the upper right corner on the first row of the memory cell array 1-1, and addresses from the mth address to the (2m−1)th address are assigned to the memory cells MC arranged from the upper left corner to the upper right corner on the first row of the memory cell array 1-2. Similarly, addresses from the 2mth address to the (3m−1)th address are assigned to the memory cells MC arranged from the left to the right on the second row of the memory cell array 1-1, and addresses from the 3mth address to the (4m−1)th address are assigned to the memory cells MC arranged from the left to the right on the second row of the memory cell array 1-2. Subsequently, the 4mth to [(2m×n)−1]th addresses are assigned to the third to the nth rows. Sense amplifier/latch circuits 2-1 and 2-2 are connected to the memory cell arrays 1-1 and 1-2 through bit lines, respectively.

An access operation of the memory device shown in FIGS. 1A and 1B will be described below. Random access of the memory device is the same as in a conventional memory device, and a description of the random access will be omitted.

An address is selected in a serial access mode as follows. A start address of serial access is input to a memory device. As shown in FIG. 1A, when a memory cell $MC_{ij}$ of the ith row and the jth column included in the memory cell array 1-1 is selected, storage data in the memory cells MC connected to the ith rows of the memory cell arrays 1-1 and 1-2 are simultaneously input to the sense amplifier/latch circuits 2-1 and 2-2. Each data input to the sense amplifier/latch circuit 2-1 or 2-2 is amplified by the sense amplifier section and then latched by the latch section. Data read access to an external device is performed by the sense amplifier/latch circuit 2-1 and then the sense amplifier/latch circuit 2-2. In particular, storage data is started to be read out from the memory cell $MC_{ij}$ located at an intersection between the ith row and the jth column of the memory cell array 1-1. The address is sequentially updated to the right, and addressing has reached the memory cell at the right end. Thereafter, the address is updated to the memory cell at left end of the ith row of the memory cell array 1-2, and the address is sequentially updated up to the memory cell MC at the right end of the memory cell array 1-2. As a result, the storage data from the memory cell $MC_{ij}$ to the memory cell at the right end of the memory cell array 1-2 is serially read out.

As shown in FIG. 1B, when a memory cell $MC_{ik}$ of the ith row and the kth column in the memory cell array 1-2 is selected by a start address of serial access, data of a memory cell MC connected to the ith row of the memory cell array 1-2 is input to the sense amplifier/latch circuit 2-2. At the same time, storage data of a memory cell MC connected to the (i+1)th row of the memory cell array 1-1 is input to the sense amplifier/latch circuit 2-1. The data input to the sense amplifier/latch circuits 2-2 and 2-1 are amplified by the sense amplifier sections and latched by the latch sections. Data read access to an external device is performed by the sense amplifier/latch circuit 2-2 and then the sense amplifier/latch circuit 2-1. More specifically, storage data is started to be read out from the memory cell $MC_{ik}$ located at an intersection between the ith row and the kth column of the memory cell array 1 2. The address is sequentially updated to the right, and addressing has reached the memory cell at the right end. Thereafter, the address is updated to the memory cell at left end of the (i+1)th row of the memory cell array 1-1, and the address is sequentially updated up to the memory cell MC at the right end of the memory cell array 1-1. As a result, the storage data from the memory cell $MC_{ik}$ to the memory cell MC at the right end of the (i+1)th memory cell array 1-1 are serially read out.

Figure 2:
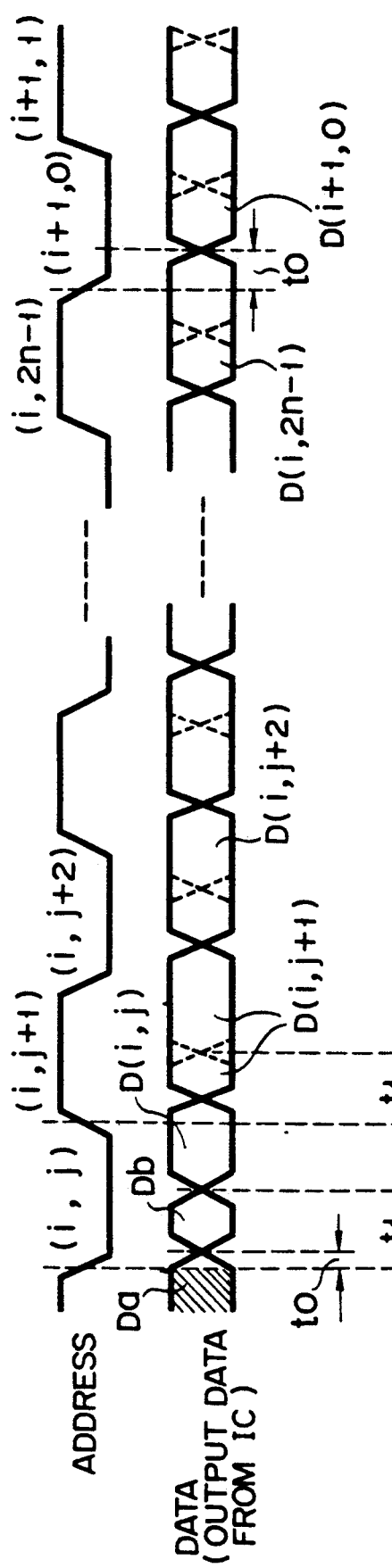
FIG. 2 is a timing chart for explaining an operation of the memory device shown in FIGS. 1A and 1B.

In a memory device employing the above scheme, the memory cell $MC_{ij}$ at the address (i,j) is selected. A change in address and a waveform of output data when serial access is performed from the memory cell $MC_{ij}$ are shown in FIG. 2. In FIG. 2, storage data of the memory cell $MC_{ij}$ accessed first is defined as Da; delay time until data is input to the sense amplifier/latch circuit 2-1 whose address is selected, t0; data of the previous cycle latched by the latch section of the sense amplifier/latch circuit 2-1, Db; and updated data, D(i,j). When the address (i,j) is selected, the data Db in the sense amplifier/latch circuit 2-1 is output after the delay time t0. However, the data is not always assigned to the address (i,j), and correct data D(i,j) is latched after a time t1 (equal to an address access time during random access), and output thereafter. At this time, data D(i,0) to D(i,m−1) in the memory cell array 1-1 are fetched in the sense amplifier/latch circuit 2-1, and data D(i,m) to D (i,2m−1) in the memory cell array 1-2 are fetched in the sense amplifier/latch circuit 2-2. Therefore, data is output with the delay time t0 in the sequential serial access. When an address (i,j+1) is accessed, the data D(i,j+1) is overwritten by the latch section of the sense amplifier/latch circuit 2-1 after the time t1 in the same sequence as random access. However, since the same data is overwritten, the output data is not changed. This occurs near only the first accessed address, the sequential data are continuously serially read out at a high speed. When the serial access start address hits a memory cell in the memory cell array 1-2 first in a similar process, i.e., an address (i,k) is selected, data D(i,k) to D(i,2m−1) which are identical with the data currently stored in sense amplifier/latch circuit 2-2 of the memory cell array 1-2 are overwritten. However, data D fetched by the sense by the sense amplifier/latch circuit 2-1 of memory cell array 101 which are different from data D(i+1,0) to D(i+1, m−1) are overwritten. For this reason, even if the address is serially updated to the next row, the data is read out at a high speed with the delay time t0.

As is apparent from the above description, according to the memory device of the present invention, storage data can be read out at a high speed as long as serial access continues.

In addition, performance of the system can be improved by only determining whether an access source is a serial source or not regardless of a physical address of a memory device. That is, a memory device need not generate a wait signal. Extremely, the memory device can be controlled by software. For example, it is assumed that the program shown in FIG. 3 is stored in the memory device. The sequence of the program is started from an address A0, fetches a jump command at addresses Ai, Ai+1, and Ai+2 and jumps to an address Aj. At this time, when an NOP (non-operation) command is fetched at an address Ai+3 and a destination address Aj (which is identical with destination addresses $Aj^1$ and $Aj^2$ since it is, as in most cases, defined by two words), this CPU can be operated in a cycle with the same delay time as in serial access.

In order to functionally operate the memory device of the present invention, the CPU can be controlled by hardware. As shown in FIG. 4, the CPU causes a program counter (PC) 3 to generate a memory address so as to fetch an operand or data from the memory device. The program counter 3 generally increments an address by one. However, when the program counter 3 receives a branch command, the program counter 3 adds a value stored in a register 4 to the address, or the value of the program counter 3 is updated, and a destination address is output as a memory address. This selection operation is performed so that a multiplexer (MUX) 5 is controlled by a control signal. When an address is incremented by one, the next data is fetched within a short period of time. When the value is added to the address or any other operation is performed, the memory device can be switched so that the next data is fetched with a long period of time by a delay circuit 7 arranged in a timing generator 6.

Calculations for EPROM read access will be exemplified as follows.

According to technical specifications, an address access time t1 is estimated as 150 ns, and a delay time t0 is about 30 ns because the delay time t0 is defined by the number of gate stages. When execution of a jump command and one instruction is assumed as the worst case, the jump command consists of a 3-byte command of an operand and 2 data and the one instruction consists of one byte Therefore, an average access time is calculated by the following equation.

$$(150 \text{ ns} \times 1 + 30 \text{ ns} \times 3)/4 = 60 \text{ ns}$$

On the contrary, when the present invention is not employed, an access time is 150 ns. Therefore, when the present invention is employed, performance can be improved 2.5 times the conventional device in the worst condition. In a practical data sequence, a probability of a jump is 1/10 to 1/100, and performance can be improved 5 times.

Figure 5:
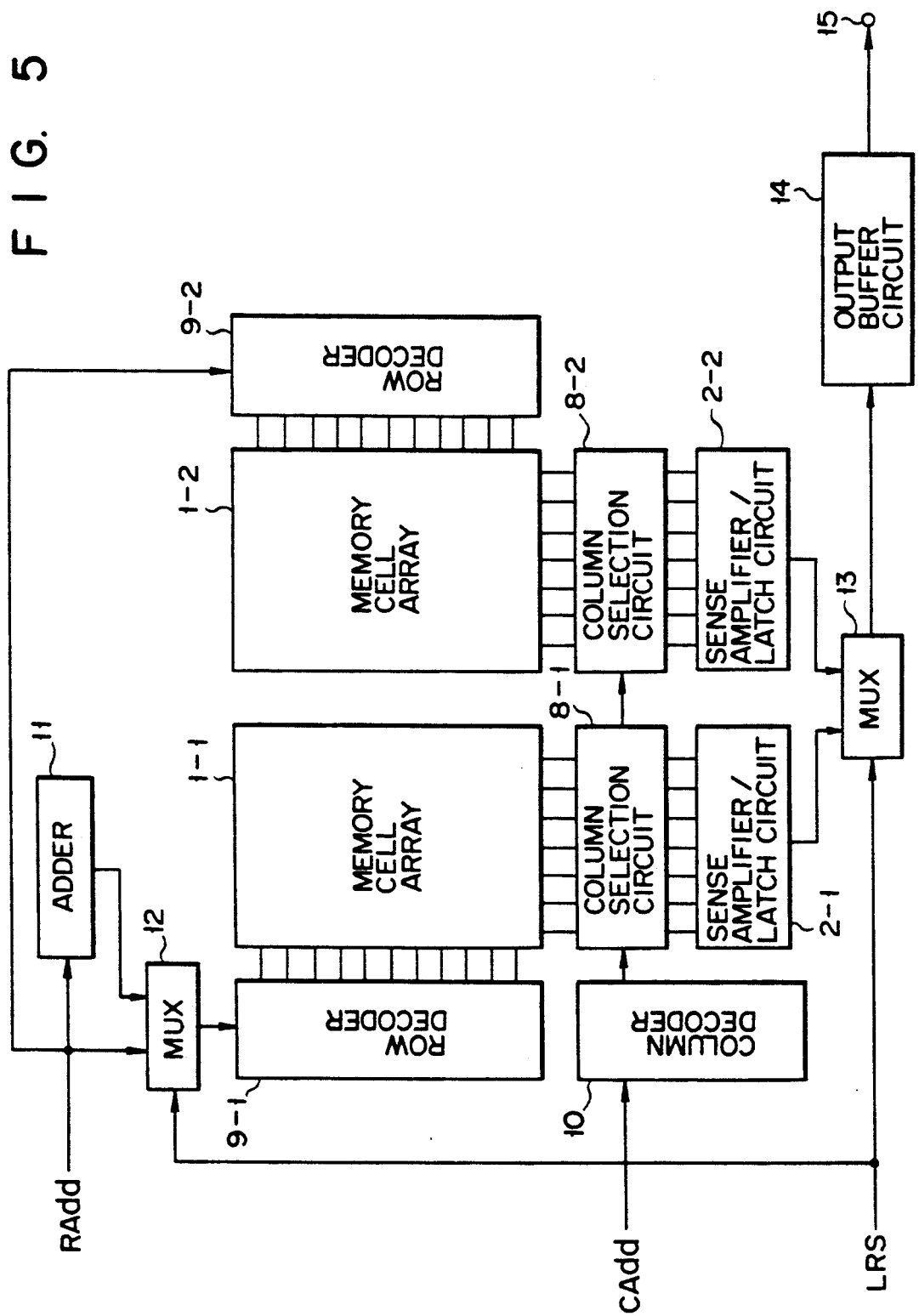
FIG. 5 is a circuit diagram showing an arrangement of a memory device for performing the operational principle shown in FIGS. 1A and 1B.

FIG. 5 is a circuit diagram showing an arrangement for practically operating the circuit shown in FIGS. 1A and 1B. In the memory cell arrays 1-1 and 1-2, column selection circuits 8-1 and 8-2 and sense amplifier/latch circuits 2-1 and 2-2 are respectively arranged. Memory cells in the memory cell array 1-1 are selected so that the column selection circuit 8-1 is controlled by outputs from a row decoder 9-1 and a column decoder 10. Similarly, memory cells in the memory cell array 1-2 are selected so that the column selection circuit 8-2 is controlled by outputs from a row decoder 9-2 and a column decoder 10. A row address signal RAdd is supplied to one input terminal of each of the row decoder 9-2, an adder 11, and a multiplexer (MUX) 12. An output from the adder 11 is supplied to the other input terminal of the multiplexer 12. The multiplexer 12 is controlled by a left/right selection signal LRS for selecting any one of the memory cell arrays 1-1 and 1-2. The left/right section signal LRS is generated on the basis of a column address signal CAdd. When a memory cell in the right memory cell array 1-2 is selected as a serial access start address, the output from adder 11 is selected by multiplexer 12 and supplied to row decoder 9-1. The output of adder 11 is a signal corresponding to an address generated by incrementing the address represented by the row address signal RAdd by one. When the left memory cell array 1-1 is selected, the row address signal RAdd is selected and supplied to row decoder 9-1. The outputs from the sense amplifier/latch circuits 2-1 and 2-2 are supplied to a multiplexer 13. The multiplexer 13 is controlled by the left/right selection signal LRS and selects latch data of the selected sense amplifier/latch circuit 2-1 or 2-2 to supply the data to an output buffer circuit 14. The data supplied to the output buffer circuit 14 is output from an output terminal 15.

In the above described arrangement, when the left/right selection signal LRS represents that a memory cell in the memory cell array 1-1 is selected by a serial access start address, the row address signal RAdd is selected by the multiplexer 12. Therefore, a row address (e.g., ith row) signal corresponding to the input row address signal RAdd is supplied to the row decoders 9-1 and 9-2. In this case, all bit lines are selected by the column selection circuits 8-1 and 8-2 in response to an output from column decoder 10. As a result, storage data of the memory cells connected to the ith row of the memory cell arrays 1-1 and 1-2 are fetched by the sense amplifier/latch circuits 2-1 and 2-2. An output of the sense amplifier/latch circuit 2-1 is selected by the multiplexer 13 first and is supplied to and read out from the output buffer circuit 14. Subsequently, an output from the sense amplifier/latch circuit 2-2 is selected and is supplied to and read out from the output buffer circuit 14.

When the left/right selection signal LRS represents that a memory cell in the left memory cell array 1-2 is designated by a serial access start address, an output from the adder 11 is selected by the multiplexer 12. Therefore, a signal corresponding to the signal defined by adding "1" to the input row address signal RAdd and the row address signal RAdd are supplied to the row decoders 9-1 and 9-2, respectively. Thus, memory cells located in the ith row of the memory cell array 1-2 are selected, and memory cells located in the (i+1)th row of the memory cell array 1-1 are selected. In this case, all the bit lines are selected by the column selection circuits 8-1 and 8-2 in response to the output from the column decoder 10, and storage data from memory cells connected to the (i+1)th row of the memory cell array 1-1 are fetched by the sense amplifier/latch circuits 2-2 and 2-1. An output from the sense amplifier/latch circuit 2-2 is selected by the multiplexer 13 first and is supplied to and read out from the output buffer circuit 14. Sequentially, an output from the sense amplifier/latch circuit 2-1 is selected and is supplied to and read out from the output buffer circuit 14.

FIG. 6 is a circuit diagram showing another arrangement for practically operating the circuit shown in FIGS. 1A and 1B. In this circuit, rows of the memory cell arrays 1-1 and 1-2 are selected by an output from a single row decoder 9, and a switching circuit 20 controlled by the left/right selection signal LRS is arranged. The switching circuit 20 is controlled to select the identical rows of the memory cell arrays 1-1 and 1-2 in response to the output from the row decoder 9 when memory cells in the left memory cell array 1-1 are selected by a serial access start address. When memory cells in the right memory cell array 1-2 are selected, the switching circuit 20 is controlled to select the selected row of the memory cell array 1-2 so as to select a row defined by adding "1" to the above selected row. That is, the switching circuit 20 comprises an inverter 16 and MOS transistors 17 and 18. The current path of the MOS transistor 17 is connected to a word line located in the identical rows of the memory cell arrays 1-1 and 1-2 and controlled to be turned on/off. The current path of the MOS transistor 18 is connected between, e.g., the word line located in the ith row of the memory cell array 1-2 and the word line located in the (i+1)th row of the memory cell arrays 1-1. Note that, the MOS transistors are arranged for all the word lines similarly to the above connecting states In FIG. 6, only the ith and (i+1)th rows are shown, and other rows are omitted. The left/right selection signal LRS is supplied to the input node of the inverter 16, and the gate of the MOS transistor 18 is connected to the output node of the inverter 16. Therefore, the MOS transistor 18 is controlled to be turned on/off by an inverted signal of the eft/right selection signal.

An operation of the circuit shown in FIG. 6 will be described below. In this circuit, n-channel transistors are used as the MOS transistors 17 and 18. When memory cells in the left memory cell array 1-1 are selected by a serial access start address, the left/right selection signal LRS goes to "H" level. When memory cells in the right memory cell array 1-2 are selected, the left/right selection signal LRS goes to "L" level. When the right memory cell array 1-1 is selected, since the left/right selection signal LRS is set at "H" level, the MOS transistor 17 is turned on and the MOS transistor 18 is turned off. Therefore, memory cells located in the ith row of the memory cell arrays 1-1 and 1-2 are selected in response to the output from the row decoder 9. As a result, storage data of the memory cells located in the ith rows of the memory cell arrays 1-1 and 1-2 are supplied to and latched by the sense amplifier/latch circuits 2-1 and 2-2. An output from the sense amplifier/latch circuit 2-1 is selected by the multiplexer 13 and is supplied to and read out from the output buffer circuit 14. Subsequently, an output from the sense amplifier/latch circuit 2-2 is selected and is supplied to and read out from the output buffer circuit 14.

In contrast to this, when the left/right selection signal LRS is set at "L" level and the left memory cell array 1-2 is selected, the MOS transistor 18 is turned on, and the MOS transistor 17 is turned off. As a result, when the ith row of the memory cell array 1-2 is selected in response to the output from the row decoder 9, the (i+1)th row of the memory cell array 1-1 is selected. Storage data of the ith row of the memory cell array 1-2 and the (i+1)th row of the memory cell array 1-1 are supplied to and latched by the sense amplifier/latch circuits 2-1 and 2-2. An output from the sense amplifier/latch circuit 2-2 is selected by the multiplexer 13 and is supplied to and read out from the output buffer circuit 14. Subsequently, an output from the sense amplifier/latch circuit 2-1 is selected and is supplied to and read out from the output buffer circuit 14.

Figure 7A:
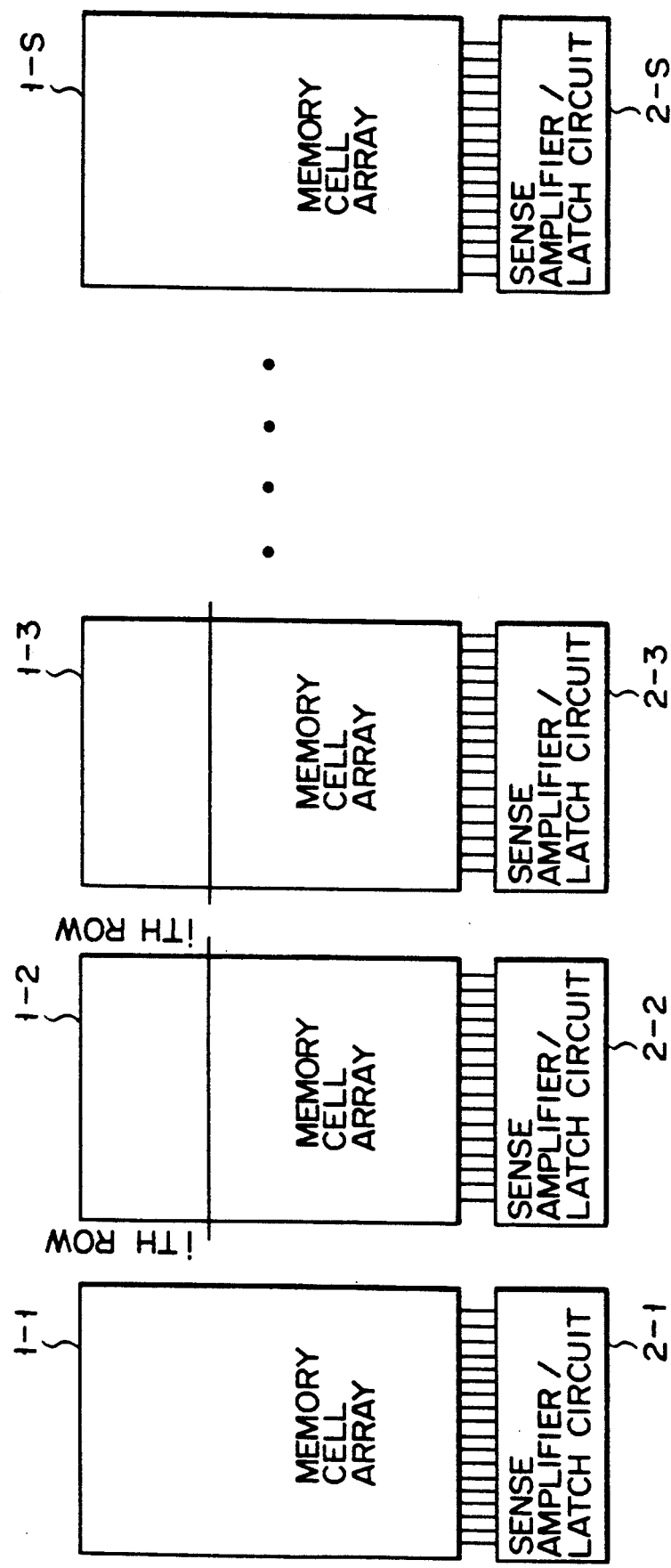
FIGS. 7A and 7B are block diagrams, for explaining the principle of a semiconductor memory device according to the second embodiment of the present invention, showing two selection states of a row address in a serial access mode when the present invention is employed to memory cell array divided into a plurality of blocks.

In the above embodiment, the case wherein a memory cell array is divided into two blocks is exemplified. However, the present invention is not limited to the two block memory cell arrays In FIGS. 7A and 7B, S (S is an integer of 2 or more) memory cell arrays 1-1 to 1-S are exemplified. As shown in FIG. 7A, when memory cells in a memory cell array 1-P (P is an integer of 1 to S-1) are selected by a serial access start address (in FIG. 7A, a case wherein the memory cell array 1-2 is selected is representatively exemplified), the selected ith row of the memory cell array 1-P including the selected memory cell and the ith row of the next memory cell array 1-(P+1) are selected. At this time, data of the selected ith row of the memory cell array 1-P is latched by the latch section of a sense amplifier/latch circuit 2-P, and data of the selected ith row of the memory cell array 1-(P+1) is latched by the latch section of a sense amplifier/latch circuit 2-(p+1). In this case, non-selected memory cell arrays 1-1 to 1-(P−1) and 1-(P+2) to 1-S may be set in an active state or a disable state. Since power consumption can be more reduced in the disable state than in the active state, the disable state is preferable. The sequential operation is similar to that of the first embodiment. When memory cells in memory cell array 1-1 to 1-(S−1) are selected, the same operations as described above are performed.

Figure 7B:
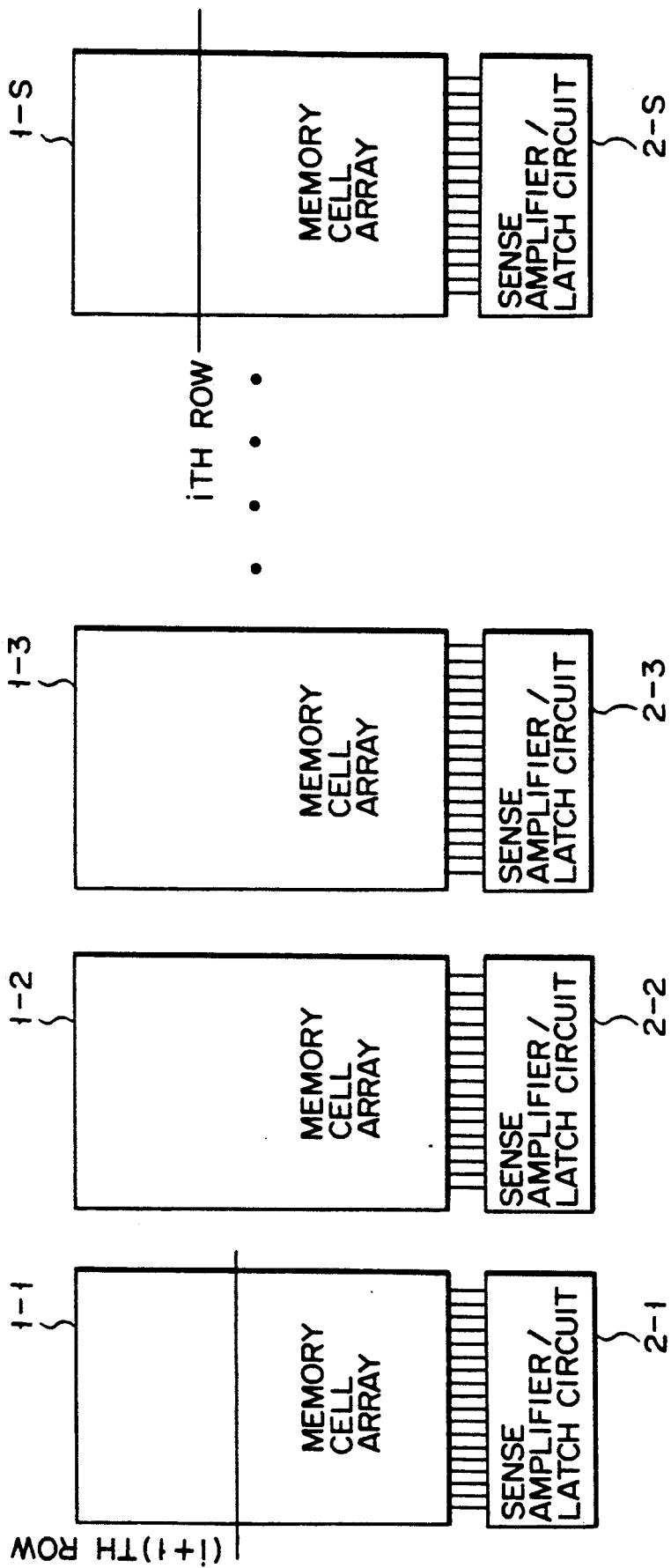

As shown in FIG. 7B, when a memory cell in the memory cell array 1-S is selected by a serial access start address, the selected ith row of the memory cell array 1-S and the (i+1)th row of the memory cell array 1-1 are simultaneously selected. Data read out from the selected ith row of the memory cell array 1-S is latched by the latch section of the sense amplifier/latch circuit 2-S, and data read out from the (i+1)th row of the memory cell array 1-1 is latched by the latch section of the sense amplifier/latch circuit 2-1. In this case, when non-selected memory cell arrays 1-2 to 1-(S−1) are set in a disable state, power consumption can be reduced. The sequential operations are similar to those of the first embodiment.

As described above, the present invention can be applied to a memory device having a plurality of blocks. Note that the present invention is more easily applied to a non-volatile semiconductor memory device such as an EPROM which need not to write data at a higher speed than a RAM.

As described above, according to the present invention, there is provided a semiconductor memory device wherein, in data serial access, the data can be continuously read out from any address at a higher speed than random access without being limited by the physical architecture of a memory device.

What is claimed is:

1. A semiconductor memory device having a serial access mode for reading data therefrom, said semiconductor memory device comprising:
a plurality of substantially corresponding memory cell block arrays $MCA_1 \ldots MCA_S$ wherein s is greater than or equal to two, each memory cell block array comprising a plurality of memory cells arranged in a respective row and column matrix;
row lines respectively coupled to memory cells which are disposed in a same row;
column lines respectively coupled to memory cells which are disposed in a same column;
sense amplifier means respectively coupled to each of said column lines for amplifying data from memory cells coupled thereto;
latch means respectively coupled to said sense amplifier means for latching data amplified by said sense amplifier means;
addressing means for addressing said memory cells;
control means for controlling the latching of data from said memory cells in a serial access mode such that data from memory cells coupled to a first row line and in a first memory cell block array containing an addressed memory cell coupled to the first row line is latched simultaneously with data from memory cells coupled to a second row line different than the first row line and in a second memory cell block array.

2. The semiconductor memory device according to claim 1 wherein said first memory cell block array comprises memory cell block array $MCA_S$ and said second memory cell block array comprises memory cell block array $MCA_1$.

3. The semiconductor memory device according to claim 2 wherein the first row line comprises row line i and the second row line comprises row line (i+1).

4. The semiconductor memory device according to claim 3 further comprising:
an output buffer coupled to said latch means for outputting data from said semiconductor memory device.

5. The semiconductor memory device according to claim 4 further comprising:
multiplexer means coupled to said latch means and said output buffer for selectively supplying latched data from one of said first memory cell array and said second memory cell array to said output buffer.

6. A method of serially reading data from a semiconductor memory device comprising a plurality of substantially corresponding memory cell block arrays $MCA_1 \ldots MCA_s$ wherein s is greater than or equal to two, each memory cell block array comprising a plurality of memory cells arranged in a respective row and column matrix, row lines respectively coupled to memory cells which are disposed in a same row, column lines respectively, coupled to memory cells which are disposed in a same column, sense amplifier means respectively coupled to each of said column lines for amplifying data from memory cells coupled thereto, and latch means respectively coupled to said sense amplifier means for latching data amplified by said sense amplifier means, the method comprising the steps of:

addressing a memory cell coupled to a first row line for reading data from said semiconductor memory device;
latching data from memory cells coupled to the first row line and in a first memory cell block array containing the addressed memory cell into the latch means associated therewith;
latching data from memory cells coupled to a second row line different than the first row line and in a second memory cell block array into the latch means associated therewith simultaneously with the latching of data from memory cells coupled to the first row line and in the first memory cell block array.

7. A semiconductor memory device comprising:
a plurality of substantially corresponding memory cell block arrays $MCA_1 \ldots MCA$, where s is greater than or equal in two, each memory cell block array comprising a plurality of memory cell arranged in a respective row and column matrix;
row lines respectively coupled to memory cells which are disposed in a same row;
column lines respectively coupled to memory cells which are disposed in a same column;
sense amplifier means coupled said column lines for amplifying data from memory cells coupled thereto;
first switches selectively connecting a row line portion of a first row line in a first memory cell block array to a row line portion of a first row line in a second memory cell block array; and
second switches selectively connecting said row line portion of said first row line of said first memory cell block array to a row line portion of a second row line of said second memory cell block array.

8. A semiconductor memory device having a serial access mode for reading data therefrom, said semiconductor memory device comprising:
a plurality of substantially corresponding memory cell block arrays $MCA_1 \ldots MCA_s$ wherein s is greater than or equal to two, each memory cell block array comprising a plurality of memory cells arranged in a respective $N \times M$ row and column matrix;
N row lines respectively coupled to memory cells which are disposed in a same row;
column lines respectively coupled to memory cells which are disposed in a same column;
sense amplifier means respectively coupled to each of said column lines, for amplifying data from the memory cells coupled thereto;
latch means respectively coupled to said sense amplifier means for latching data amplified by said sense amplifier means;
addressing means for addressing said memory cells; and
control means for controlling the latching of data from said memory cells in the serial access mode such that data from memory cells in a first row of a first memory cell block array containing an addressed memory cell coupled to the first row line is latched simultaneously with data from memory cells in a second row of a second memory cell block array wherein said first memory cell block array comprises memory cell block array $MCA_s$ and said second memory block cell array comprises memory cell block array $MCA_1$ and the first row comprises row 1 and the second row comprises row (i+1).

9. A semiconductor memory device, comprising:

first and second memory arrays each having a plurality of memory cells arranged in row and columns, wherein an address of a last memory cell in a first row of said first memory array and an address of a first memory cell in a respectively corresponding first row of said second memory array are sequential, and (2) an address of a last memory cell in the first row of said second memory array and an address of a first memory cell in a second row of said first memory array are sequential;

word lines including a first word line having a first portion coupled to the memory cells in the first row of said first memory array and a second portion coupled to the memory cells in the first row of said second memory array, and a second word line having a first portion coupled to the memory cells in the second row of said first memory cell array;

row decoder means responsive to a row address signal for selecting word lines;

bit lines respectively connected to the memory cells in each column of said first and second memory arrays;

sense amplifier means connected to said bit lines for sensing and amplifying data read out from said memory cells;

latch means respectively connected to said sense amplifier means for latching data sensed and amplified by said sense amplifier means;

a first switch connected between said first and second portions of said first word line; and a second switch connected between said first portion of said second word line and said second portion of said first word line.

10. A semiconductor memory device, comprising:

first and second memory arrays each having a plurality of memory cells arranged in rows and columns, wherein an address of a last memory cell in a first row of said first memory array and an address of a first memory cell in a respectively corresponding first row of said second memory array are sequential, and (2) an address of a last memory cell in the first row of said second memory array and an address of a first memory cell in a second row of said first memory array are sequential;

word lines coupled to the memory cells in rows of said first and second memory arrays;

row decoder circuitry for selecting word lines of said first and second memory array;

bit lines respectively connected to the memory cells in each column of said first and second memory arrays;

sense amplifier means connected to said bit lines for sensing and amplifying data read out from said memory cells;

latch means respectively connected to said sense amplifier means for latching data sensed and amplified by said sense amplifier means;

control circuitry for controlling said row decoder circuitry such that data from memory cells in the first row of said second memory array and data from memory cells in the second row of said first memory array are simultaneously latched in said latch means.

11. The semiconductor memory device according to claim 10, wherein said row decoder circuitry comprises a first row decoder for selecting word lines of said first memory array and a second row decoder for selecting word lines of said second memory array.

* * * * *